United States Patent
Yadav et al.

(10) Patent No.: US 6,896,929 B2
(45) Date of Patent: May 24, 2005

(54) SUSCEPTOR SHAFT VACUUM PUMPING

(75) Inventors: Sanjay Yadav, Redwood City, CA (US); Quanyuan Shang, Saratoga, CA (US); Ernst Keller, Sunnyvale, CA (US); Wei Chang, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 533 days.

(21) Appl. No.: 09/922,352

(22) Filed: Aug. 3, 2001

(65) Prior Publication Data

US 2003/0026904 A1 Feb. 6, 2003

(51) Int. Cl.⁷ ............................................. C23C 16/00
(52) U.S. Cl. ..................... 427/248.1; 427/294; 118/728
(58) Field of Search .............................. 427/248.1, 294; 118/728

(56) References Cited

U.S. PATENT DOCUMENTS 4,737,824 A * 4/1988 Sakai et al. ................... 355/53

FOREIGN PATENT DOCUMENTS

WO       WO 01/07691 A1 *  2/2001

* cited by examiner

*Primary Examiner*—Timothy Meeks
(74) *Attorney, Agent, or Firm*—Benjamin A. Adler

(57) ABSTRACT

Provided herein is a method of improving the planarity of a support plate of a susceptor for use during deposition of a film of material onto a substrate comprising the steps of reducing pressure in a hollow core of a shaft to a level below atmospheric pressure; and reducing a pressure in the deposition chamber to a level required for the deposition of the film of material onto the substrate, where the pressure in the hollow core of the shaft acts upon a lower surface of the support plate connected to the shaft and interfacing with the hollow core of the shaft and the pressure in the deposition chamber acts upon an upper surface of the support plate adapted to support the substrate thereby improving planarity. Also provided are a susceptor and a method of depositing a film onto a substrate affixed to the susceptor of the present invention.

43 Claims, 8 Drawing Sheets

(W)

| -225mils | 0 | -225mils |
|---|---|---|
| -195mils | 0 | -225mils |
| -225mils | 0 | -225mils |

Surface flatness (W)

| -29mils | -4mils | -29mils |
|---|---|---|
| -26mils | 0 | -27mils |
| -30mils | -4mils | -30mils |

(inverted V-shape)

Fig. 3A

| | | | |
|---|---|---|---|
| | -5mils | -2mils | -7mils |
| (w) | -2mils | 0 | -2mils |
| | -7mils | -2mils | -5mils |

Surface flatness

| | | | |
|---|---|---|---|
| | -12mils | -7mils | -12mils |
| (w) | -8mils | 0 | -8mils |
| | -12mils | -7mils | -12mils |

Fig. 3B

SUSCEPTOR SHAFT VACUUM PUMPING

BACKGROUND OF THE INVENTION

1. Field of the Invention

The present invention relates generally to the fields of semiconductor manufacturing and deposition chambers. More specifically, the present invention relates to a method of improving the planarity of a susceptor during a deposition process.

2. Description of the Related Art

The fabrication of thin films as insulators, conductors, dielectrics or other layers upon a substrate, e.g., a semiconductor wafer or a glass plate, is accomplished by various deposition processes. Common among these are chemical vapor deposition (CVD) and physical vapor deposition (PVD or sputtering) processes both of which encompasses more specialized means of deposition. The application of such processes to a substrate requires that the substrate be disposed in a deposition chamber in such a manner that the resulting deposited thin film has optimal qualities, such as, inter alia, conformality, deposition rate uniformity across the substrate, thickness uniformity, and film smoothness, for its intended use.

To process substrates using these deposition techniques, a vacuum chamber may be provided having a susceptor configured to receive a substrate. A susceptor is a mechanical part that holds a substrate in a processing chamber for a fabrication step, e.g., CVD. For example, a CVD apparatus includes a susceptor positioned within a deposition chamber. The support plate of the susceptor supports a substrate, such as a glass panel or a semiconductor wafer, onto which a film of material is deposited by thermal decomposition of at least one precursor gas.

During a deposition process, the pressure is lowered to reduce the overall pressure in the deposition chamber. This results in forces pushing up on the undersurface of the susceptor because the susceptor shaft, usually a tube-like structure, is at atmospheric pressure. This pressure differential may cause the susceptor surface to deform or to "bow". As substrate size increases with a necessary concomitant increase in susceptor size, this deformation is amplified. This causes the irregular deposition of thin films onto a substrate held on the susceptor surface.

Additionally, the materials usually used to manufacture susceptors are aluminum-based materials such a s aluminum nitride. Although resistive to process gases and contamination, susceptors manufactured from these materials significantly tend to lose rigidity at temperatures of about 300° C. or higher. The substrate support surface is, therefore, less likely to remain planar, particularly coupled with the pressure differential exerting force on the underside of the support surface.

In FIG. 1 deformation of an aluminum-based substrate 235 in a reduced pressure environment provided by a processing chamber 200 at temperatures at about 300° C. is depicted. As the pressure of the internal environment of the chamber 200 is drawn down below atmsopheric pressure by vacuum pumping 220 and as the temperature reaches about 300° C. or above, the reduced rigidity of the aluminum-based support plate 210 is acted upon by the unequal pressures on the top and underside of the support plate 210 and thereby deforms.

The susceptor shaft, being hollow and exposed to atmospheric pressure of about 760 Torr, also, therefore, exposes the undersurface of the center portion of the support plate 210 to atmospheric pressure. This may cause bowing 212 in the center portion of the upper face or support surface 216 of the susceptor plate 210, since the upper surface is exposed to the reduced pressure environment. At the same time, the edges of periphery of the susceptor plate 216 may sag 214 due to the reduced rigidity of the susceptor material and this may be exacerbated when bowing is present. Overall, the result is a nonplanar susceptor surface 216.

In a deposition process, the processing material to be deposited on the substrate must travel in some form from the input across the deposition chamber to the surface of the substrate. This distance, whether it is the input distance from a gas distribution plate to the substrate in a CVD application or the distance from a sputterable target to the substrate in a PVD application, can affect the deposition rate of the film onto the substrate. If the substrate is supported on a deformed susceptor plate as described above, the periphery of the substrate surface is at a greater distance from the input of the processing materials than is the center of the substrate surface. Thus the deposition rate at the center of the substrate surface is greater than at the periphery of the substrate surface. The resulting unevenly deposited film may be defective or incapable of performing a s intended.

Typically, a broader range of deposition processes can be conducted at higher temperatures. A greater variety of layers can be deposited at temperatures above about 300° C. It would be advantageous to provide an aluminum-based susceptor system that maintains a planar substrate support surface at temperatures of greater than about 300° C. and in a reduced pressure atmosphere.

Therefore, the prior art is deficient in the lack of effective means of improving the planarity of a susceptor during a deposition process. Specifically, the prior art is deficient in the lack of effective means of vacuum pumping on a susceptor shaft to improve the planarity of the susceptor surface. The present invention fulfills these long-standing needs and desires in the art.

SUMMARY OF THE INVENTION

In one embodiment of the present invention there is provided a method of improving the planarity of a support plate of a susceptor for use during deposition of a film of material onto a substrate comprising the steps of reducing pressure in a hollow core of a shaft to a level below atmospheric pressure; and reducing a pressure in the deposition chamber to a level required for the deposition of the film of material onto the substrate, where the pressure in the hollow core of the shaft acts upon a lower surface of the support plate connected to the shaft and interfacing with the hollow core of the shaft and the pressure in the deposition chamber acts upon an upper surface of the support plate adapted to support the substrate thereby improving planarity.

In another embodiment of the present invention there is provided a method of improving the planarity of a support plate of a susceptor for use during deposition of a film of material onto a substrate comprising the steps of reducing a pressure in the deposition chamber to about 0.5 Torr to about 200 Torr; sealing a hollow core of a shaft from atmospheric pressure with a shaft vacuum connector housing, where the shaft vacuum connector housing comprises a fitting adapted to connect to a source of negative pressure; applying the source of negative pressure to the hollow core of the shaft through the fitting; and reducing pressure in the hollow core of the shaft through the fitting from about 0.5 to about 200 Torr, where the pressure in the hollow core of the shaft acts upon a lower surface of the support plate connected to the shaft and interfacing with the hollow core of the shaft and the pressure in the deposition chamber acts upon an upper surface of the support plate adapted to support the substrate thereby improving planarity.

In yet another embodiment of the present invention there is provided a susceptor for use in a deposition chamber for depositing a film of material onto a substrate, the susceptor comprising a support plate mounted on a shaft having a hollow core, the support plate having an upper surface adapted to support a substrate and a lower surface connected to the shaft and interfacing with the hollow core; wherein the hollow core is sealed from atmospheric pressure; and an input for applying negative pressure inside the hollow core and interfacing with the lower surface of the substrate support plate.

In yet another embodiment of the present invention there is provided a susceptor for use in a deposition chamber for depositing a film of material onto a substrate, the susceptor comprising a support plate mounted on a shaft having a hollow core, the support plate having an upper surface adapted to support a substrate and a lower surface connected to the shaft and interfacing with the hollow core; a shaft vacuum connector housing; the shaft vacuum connector housing sealing the hollow core from atmospheric pressure; and an input located on the shaft vacuum connector housing, the input applying negative pressure inside the hollow core and interfacing with the lower surface of the substrate support plate.

In yet another embodiment of the present invention there is provided a method of depositing a film of material onto a substrate comprising the steps of affixing the substrate to an upper surface of a support plate of the susceptor disclosed herein in a deposition chamber; reducing a pressure in the deposition chamber to a deposition pressure; reducing a pressure inside a hollow core of a shaft of the susceptor to below atmospheric pressure wherein the pressure in the hollow core of the shaft is applied to a lower surface of the support plate of the susceptor; flowing at least one precursor gas into the deposition chamber; and depositing a film onto the substrate wherein the film is generated at least in part from the at least one precursor gas.

In yet another embodiment of the present invention there is provided a method of depositing a film on a substrate comprising the steps of affixing a substrate to an upper surface of a support plate of the susceptor disclosed herein in a deposition chamber; bringing the temperature inside the deposition chamber to at least 300° C.; reducing a pressure in the deposition chamber to about 0.5 Torr to about 6 Torr; reducing a pressure inside a hollow core of a shaft of the susceptor from about 0.5 Torr to about 200 Torr wherein the pressure in the hollow core of the shaft is applied to a lower surface of the support plate of the susceptor; flowing at least one precursor gas into the deposition chamber; depositing a film onto the substrate wherein the film is generated at least in part from the at least one precursor gas; monitoring the deposition pressure and the pressure inside the hollow core of the shaft; and adjusting the pressure inside the hollow core of the shaft when it exceeds a value outside a predetermined value range relative to the pressure in the deposition chamber during deposition of the film of material onto the substrate.

In yet another embodiment of the present invention there is provided method of depositing a film on a substrate comprising the steps of affixing a substrate to an upper surface of a support plate of the susceptor disclosed herein in a deposition chamber; bringing the temperature inside the deposition chamber to at least 300° C.; reducing a pressure in the deposition chamber to about 0.5 Torr to about 6 Torr; reducing a pressure inside a hollow core of a shaft of the susceptor from about 0.5 Torr to about 200 Torr wherein the pressure in the hollow core of the shaft is applied to a lower surface of the support plate of the susceptor; flowing at least one precursor gas into the deposition chamber; depositing a film onto the substrate wherein the film is generated at least in part from the at least one precursor gas; monitoring the planarity of a surface of the substrate onto which the film is to be deposited; and adjusting the pressure inside the hollow core of the shaft when the surface of the substrate deforms by more than a predetermined acceptable amount from perfectly planar thereby bringing the susceptor and the substrate back within acceptable planarity limits during deposition of the film of material onto the substrate.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIG. 2 depicts various cross-sectional schematic representations of the susceptor and the susceptor shaft disposed within the deposition chamber.

FIG. 3 compares the change in surface flatness across the susceptor support plate attached to a shaft with no vacuum pumping (FIG. 3A) and with vacuum pumping (FIG. 3B). Tests were conducted using a 4300LTP 620×750 susceptor.

DETAILED DESCRIPTION OF THE INVENTION

Figure 1:
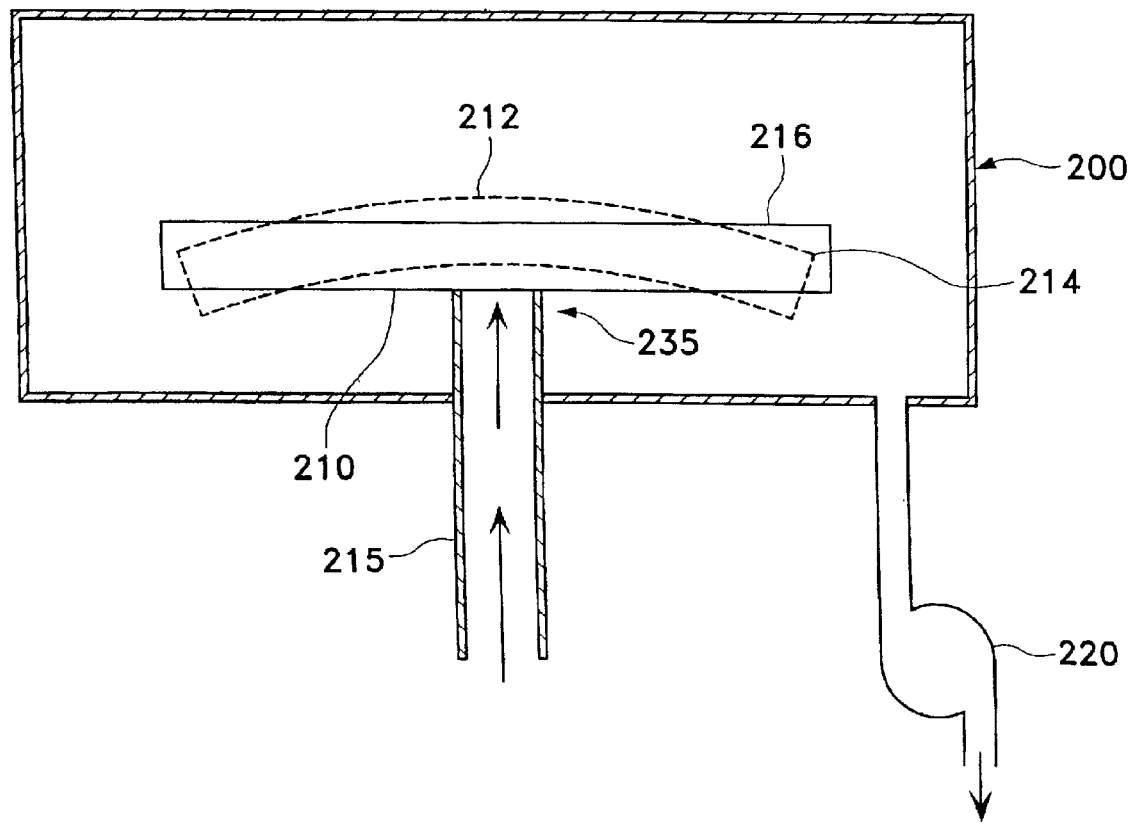
FIG. 1 is a schematic representation of a processing chamber depicting deformation of a susceptor under conditions of reduced pressure and a temperature of about 300° C.

In one embodiment of the present invention there is provided a method of improving the planarity of a support plate of a susceptor for use during deposition of a film of material onto a substrate comprising the steps of reducing pressure in a hollow core of a shaft to a level below atmospheric pressure; and reducing a pressure in the deposition chamber to a level required for the deposition of the film of material onto the substrate, where the pressure in the hollow core of the shaft acts upon a lower surface of the support plate connected to the shaft and interfacing with the hollow core of the shaft and the pressure in the deposition chamber acts upon an upper surface of the support plate adapted to support the substrate thereby improving planarity.

In one aspect of this embodiment the pressure in the hollow core of the shaft is reduced by sealing the hollow core of the shaft from atmospheric pressure; and applying a source of negative pressure to the hollow core of the shaft thereby reducing the pressure in the hollow core. A representative example is a shaft vacuum connector housing which is adapted to connect with the source of the negative pressure, for example, by a fitting such that the negative pressure is applied through the fitting.

In another aspect of this embodiment the upper surface of the support plate may contain a plurality of openings passing through the upper surface and adapted to affix the substrate to the upper surface by applying a vacuum thereto. The openings are fluidly connected with a vacuum line passing through the hollow core of the shaft and generate a negative pressure independent from the pressure generated in the hollow core of the shaft.

In this embodiment deposition temperature is at least 300° C. with a representative example being about 400° C. to about 450° C. The deposition chamber pressure is from about 0.5 Torr to about 6 Torr. The pressure in the shaft is brought to a level below about 200 Torr, a representative example being from about 0.5 Torr to about 200 Torr. Additionally, the shaft pressure may be brought to a level equaling that of the pressure in the deposition chamber.

In another embodiment of the present invention there is provided a method of improving the planarity of a support plate of a susceptor for use during deposition of a film of material onto a substrate comprising the steps of reducing a pressure in the deposition chamber to about 0.5 Torr to about 200 Torr; sealing a hollow core of a shaft from atmospheric pressure with a shaft vacuum connector housing, where the shaft vacuum connector housing comprises a fitting adapted to connect to a source of negative pressure; applying the source of negative pressure to the hollow core of the shaft through the fitting; and reducing pressure in the hollow core of the shaft through the fitting from about 0.5 to about 200 Torr, where the pressure in the hollow core of the shaft acts upon a lower surface of the support plate connected to the shaft and interfacing with the hollow core of the shaft and the pressure in the deposition chamber acts upon an upper surface of the support plate adapted to support the substrate thereby improving planarity.

In an aspect of this embodiment the upper surface of the support plate may contain a plurality of openings and the vacuum line fluidly connected thereto. The shaft pressure may equal that of the pressure in the deposition chamber as disclosed above.

In yet another embodiment of the present invention there is provided a susceptor for use in a deposition chamber for depositing a film of material onto a substrate, the susceptor comprising a support plate mounted on a shaft having a hollow core, the support plate having an upper surface adapted to support a substrate and a lower surface connected to the shaft and interfacing with the hollow core; wherein the hollow core is sealed from atmospheric pressure; and an input for applying negative pressure inside the hollow core and interfacing with the lower surface of the substrate support plate.

In one aspect of this embodiment the susceptor has a shaft vacuum connector housing as described above. Additionally, the susceptor may contain the plurality of openings on the upper surface of the support plate and the vacuum line fluidly connected thereto as described above.

In yet another embodiment of the present invention there is provided a susceptor for use in a deposition chamber for depositing a film of material onto a substrate, the susceptor comprising a support plate mounted on a shaft having a hollow core, the support plate having an upper surface adapted to support a substrate and a lower surface connected to the shaft and interfacing with the hollow core; a shaft vacuum connector housing; the shaft vacuum connector housing sealing the hollow core from atmospheric pressure; and an input located on the shaft vacuum connector housing, the input applying negative pressure inside the hollow core and interfacing with the lower surface of the substrate support plate. The susceptor may contain the plurality of openings on the upper surface of the support plate and the vacuum line fluidly connected thereto as described above.

In yet another embodiment of the present invention there is provided a method of depositing a film of material onto a substrate comprising the steps of affixing the substrate to a n upper surface of a support plate of the susceptor disclosed herein in a deposition chamber; reducing a pressure in the deposition chamber to a deposition pressure; reducing a pressure inside a hollow core of a shaft of the susceptor to below atmospheric pressure wherein the pressure in the hollow core of the shaft is applied to a lower surface of the support plate of the susceptor; flowing at least one precursor gas into the deposition chamber; and depositing a film onto the substrate wherein the film is generated at least in part from the at least one precursor gas. The temperatures and pressures may be those described above.

In one aspect of this embodiment the deposition pressure and the pressure inside the hollow core of the shaft are monitored and the pressure inside the hollow core of the shaft is adjusted when it exceeds a value outside a predetermined value range relative to the pressure in the deposition chamber.

In another aspect of this embodiment the planarity of a surface of the substrate onto which the film is to be deposited is monitored and the pressure inside the hollow core of the shaft is adjusted when the surface of the substrate deforms by more than a predetermined acceptable amount from perfectly planar which brings the susceptor and the substrate back within acceptable planarity limits.

In yet another embodiment of the present invention there is provided a method of depositing a film on a substrate comprising the steps of affixing a substrate to an upper surface of a support plate of the susceptor disclosed herein in a deposition chamber; bringing the temperature inside the deposition chamber to at least 300° C.; reducing a pressure in the deposition chamber to about 0.5 Torr to about 6 Torr; reducing a pressure inside a hollow core of a shaft of the susceptor from about 0.5 Torr to about 200 Torr wherein the pressure in the hollow core of the shaft is applied to a lower surface of the support plate of the susceptor; flowing at least one precursor gas into the deposition chamber; depositing a film onto the substrate wherein the film is generated at least in part from the at least one precursor gas; monitoring the deposition pressure and the pressure inside the hollow core of the shaft; and adjusting the pressure inside the hollow core of the shaft when it exceeds a value outside a predetermined value range relative to the pressure in the deposition chamber during deposition of the film of material onto the substrate. The temperature in the deposition chamber may be from about 400° C. to about 450° C. Pressure in the shaft may be equal to that in the deposition chamber.

In yet another embodiment of the present invention there is provided method of depositing a film on a substrate comprising the steps of affixing a substrate to an upper surface of a support plate of the susceptor disclosed herein in a deposition chamber; bringing the temperature inside the deposition chamber to at least 300° C.; reducing a pressure in the deposition chamber to about 0.5 Torr to about 6 Torr; reducing a pressure inside a hollow core of a shaft of the susceptor from about 0.5 Torr to about 200 Torr wherein the pressure in the hollow core of the shaft is applied to a lower surface of the support plate of the susceptor; flowing at least one precursor gas into the deposition chamber; depositing a film onto the substrate wherein the film is generated at least in part from the at least one precursor gas; monitoring the planarity of a surface of the substrate onto which the film is to be deposited; and adjusting the pressure inside the hollow core of the shaft when the surface of the substrate deforms by more than a predetermined acceptable amount from perfectly planar thereby bringing the susceptor and the substrate back within acceptable planarity limits during deposition of the film of material onto the substrate. The temperature in the deposition chamber may be from about 400° C. to about 450° C. Pressure in the shaft may be equal to that in the deposition chamber.

Provided herein is a method of improving the planarity of a susceptor surface attached to a susceptor shaft by providing a vacuum source operably associated with the susceptor shaft to reduce pressure in the susceptor shaft to below atmospheric pressure. As the chamber pressure is reduced to below atmospheric pressure the differential between the chamber pressure and the pressure in the susceptor shaft increases. The force that the pressure within the susceptor shaft exerts on the susceptor surface is proportional to the difference between the chamber pressure and the pressure in the shaft. As the pressure differential increases, the susceptor surface deforms and becomes bowed.

At temperatures less than about 300° C. in a deposition process, the effects of a pressure differential on an aluminum or aluminum-containing susceptor are generally localized in the center of the susceptor surface. However, at higher temperatures, those greater than about 300° C., the susceptor is less rigid, so not only does the pressure differential act on the center of the susceptor surface deflecting it upward, but the corners and edges of the susceptor surface sag.

A vacuum line applies a negative pressure to the inside space of the shaft thereby bringing the pressure interfacing the underside of the susceptor plate below atmospheric pressure. Vacuum pressure on the shaft can be initiated simultaneously or sequentially with the initiation of vacuum pressure in the chamber. By pulling a vacuum on both the deposition chamber and the susceptor shaft, the pressure differential on either side of the susceptor decreases thus eliminating the resultant force on the susceptor that would cause the surface to deform. Thus, the upper surface of the susceptor may be maintained essentially flat or planar even at temperatures over about 300° C. Deformation of films deposited on a substrate normally due to a nonplanar susceptor surface is minimized. Films deposited using a planar susceptor surface have better uniformity characteristics such as film thickness and deposition rate.

Thin films may be deposited on a substrate affixed to a susceptor as described herein in a chamber designed for applications such as, although not limited to, rapid thermal processing or vapor deposition processes. Such vapor deposition processes may be chemical vapor deposition (CVD), plasma enhanced chemical vapor deposition (PECVD) or physical vapor deposition or sputtering (PVD). Films deposited may be, although not limited to, amorphous silicon (a-Si), silicon nitride (SiN), silicon oxide or thermal oxide ($SiO_2$) or silicon oxynitride (SiON) and such precursors as silane ($SiH_4$), TEOS, $NH_3$, $H_2$, $N_2$, $N_2O$, $PH_3$, $CO_2$ and the like may also be used.

During the deposition process, the process temperature is from about 150° C. to about 450° C., usually at least 300° C., although many processes require temperatures of about 400° C. to about 450° C. For optimal deposition, the substrate temperature may be within about 20° C. of the temperature of the substrate support surface. The chamber pressure is about 100 to about 200 Torr when idle and is subsequently pumped down to about 0.5 to about 6 Torr prior to initiation of deposition. Simultaneously, the susceptor shaft is being pumped down unless a static processing pressure has already been established in the shaft.

The following examples are given for the purpose of illustrating various embodiments of the invention and are not meant to limit the present invention in any fashion.

EXAMPLE 1

Susceptor System with Vacuum Pumping

Figure 2A:
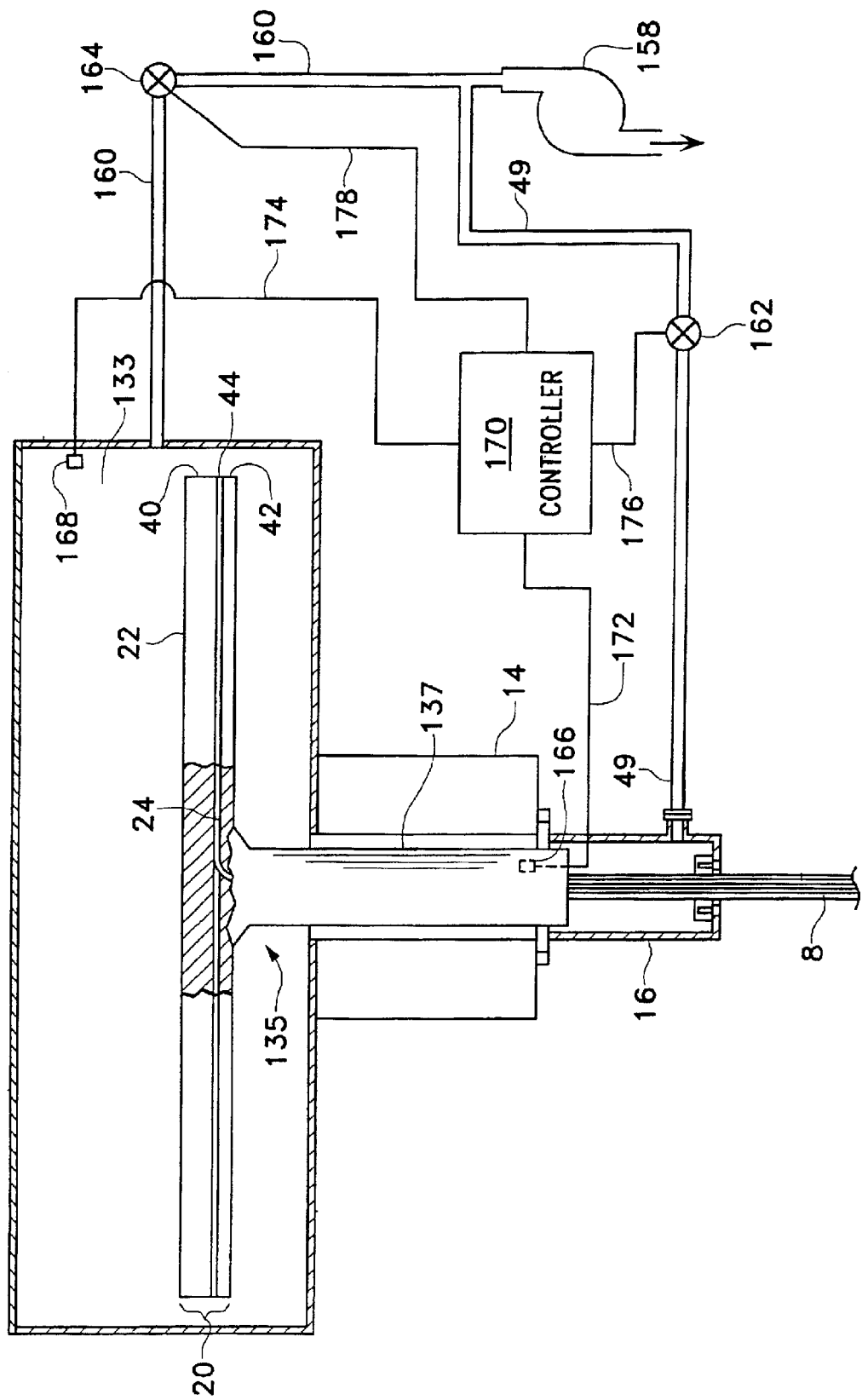
FIG. 2A shows how the negative pressure is applied in the susceptor shaft and a feedback control system for monitoring and controlling the deposition chamber pressure and the pressure within the shaft.

The susceptor system including vacuum pumping mechanism shown in FIG. 2A disposed within a processing chamber 133 comprises the susceptor 135 which includes the susceptor shaft 137 and a substrate support plate 20, a motor 14, a shaft vacuum connector housing 16 and a controller 170. The support plate 20 includes a top plate 40, a base plate 42 and braised region 44 therebetween; the top and base portions may also be joined by welding or other equivalent techniques. The support plate 20 may contain heating element(s) 24 disposed between the top plate 40 and the base plate 42.

The support plate 20 is attached to the shaft 137 by welding, brazing or other conventional means. The shaft 137 includes a hollow core and is configured to mate with the base plate 42 of the support plate 20. The susceptor 135 is moved vertically and/or rotatably by means of the shaft 137 that is operably connected to a motor 14. A shaft vacuum housing 16 is affixed below the motor 14 and provides the means to operably connect a vacuum line 49 of a vacuum source such as a vacuum pump (not shown) to the shaft 137. The vacuum line 49 may be connected to a vacuum pump that is separate from the vacuum exhaust pump for the deposition chamber, or may be connected to the vacuum exhaust pump so as to be individually controlled When connected to the vacuum exhaust pump, separate throttle valves 162, 164 connected to vacuum lines 49, 160 may be employed for independently adjusting the amount of vacuum applied within the chamber and within the susceptor shaft. The shaft vacuum connector housing 16 may be comprised of aluminum or an aluminum alloy or any other material or alloy apparent to one of ordinary skill in the art.

Optionally a vacuum chuck may be use to secure the substrate to the upper face 22 of the support plate 20. In this case, a vacuum line 8 is connected to a source of vacuum, such as a vacuum pump, which is separate from the vacuum exhaust pump for the deposition chamber itself. The vacuum line 8 passes from a plurality of evenly spaced vacuum ports (not shown) in the upper face 22 of the support plate 20, through shaft 137 to the vacuum source. Activating the vacuum source causes the substrate mounted on the susceptor 135 to be drawn down uniformly onto the upper face 22 of the support plate 20 to chuck it there. If a vacuum chuck is used to chuck the substrate onto the upper face of the support plate 22, then the vacuum source to the shaft may also be the same source of vacuum used for the vacuum line 8 to the vacuum chuck and, thus, the throttle valve controls both. Vacuum line 49 is connected to an external vacuum pump 158, which is also fluidly connected to the chamber 133 via vacuum line 160. Pressure sensors 166, 168 monitor the shaft pressure and the chamber pressure and provide feedback through input lines 172, 174 to a controller 170.

The controller 170 can be programmed to maintain a static pressure within shaft 137 or, alternatively, may be programmed to adjust the pressure within shaft 137 dynamically, to retain a predefined relationship with the pressure within the chamber 133 as the pressure in chamber 133 changes. For example, during transfer of a substrate into or out of the chamber 133, the chamber pressure may be maintained at about 100–200 Torr. Idling pressure in the chamber may be around the same, about 100–200 Torr. However, during processing, the pressure in the chamber is pumped down to a lower pressure, e.g., 5–10 Torr. Sensors 166, 168 signal the controller 170 to open the throttle valve 162 so the shaft pressure is pumped down proportionately to the chamber pressure; when the chamber is no longer at idling pressure, the shaft pressure is altered to a lower value accordingly to maintain pressure equilibrium on either side of the susceptor support plate 20. Although the shaft pressure may be pumped down to between about 5–10 Torr, a higher pressure is sufficient. At higher temperatures the susceptor material will retain some degree of rigidity and so can withstand some pressure differential without deforming.

Additionally, the controller 170 can maintain the shaft pressure to within predetermined levels of the chamber pressure. For example, the shaft pressure may be maintained at three times that of the chamber pressure, but not to exceed a certain level, such as 200 Torr or, alternatively, the shaft pressure could be maintained at a specific pressure in excess of the chamber pressure, such as 200 Torr above chamber pressure. Although not restricted to these values, i.e, shaft pressure may be reduced as low as, or any value in between, that value equaling chamber pressure during processing, it is contemplated that shaft pressure be no less than about 200 Torr.

Alternative Methods of Monitoring Susceptor Shaft Pressure

Figure 2B:
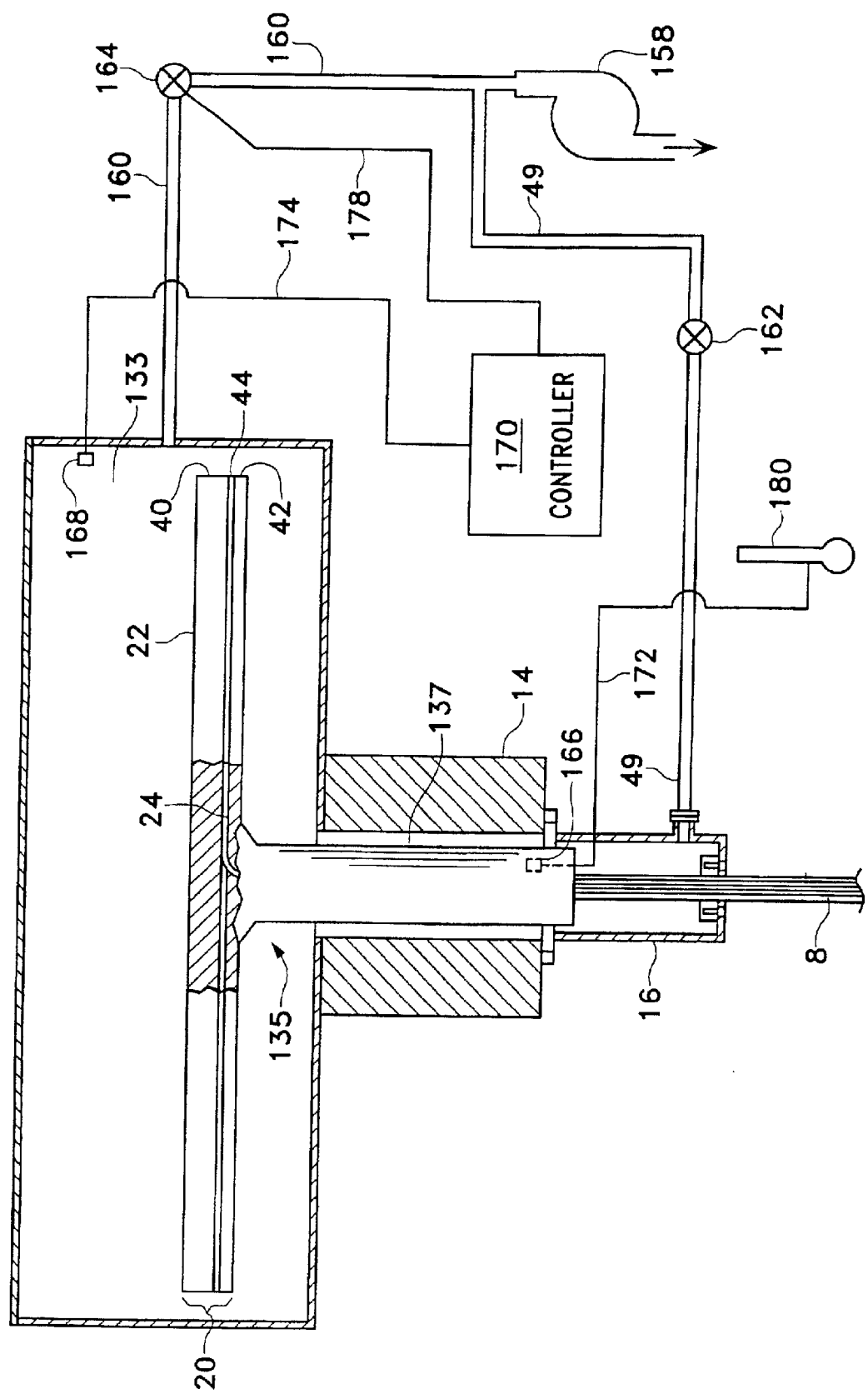
FIG. 2B shows an alternative separate monitor and control arrangement for the pressure within the shaft.

It is contemplated that alternative methods of monitoring shaft pressure can be used to maintain shaft pressure at a level to insure planarity of the susceptor surface 22. For example, a manometer 180 or other pressure indicator receives input from sensor 166 (FIG. 2B). Such a system allows for visual monitoring by an operator who then sets the throttle valve 162 to maintain the shaft pressure at a desired static pressure. Alternatively, the manometer 180 is connected to the throttle valve 162, so that an operator may set the manometer 180 to a desired setting and thereby control the throttle valve 162. As in the susceptor system described above, the shaft can be either fluidly connected to the vacuum source 158 for the deposition chamber or a separate source.

Figure 2C:
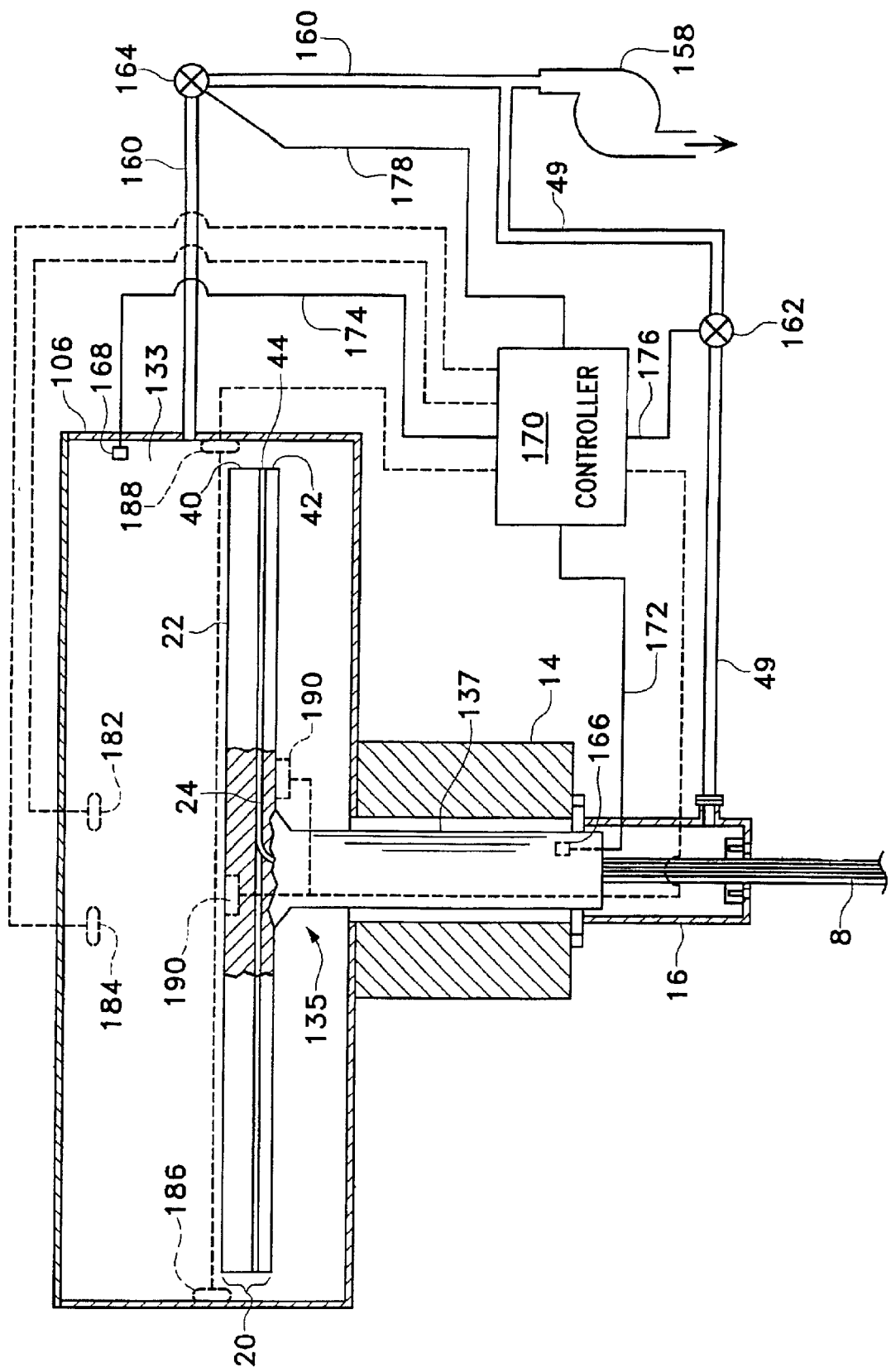
FIG. 2C shows a feedback conrol system for monitoring and controlling the deposition chamber pressure and the pressure within the shaft. Additionally, optional sensors are shown for various methods of monitoring the physical deformation of the susceptor support plate/substrate surface.

It is further contemplated that the pressure within the susceptor shaft 137 may be controlled dynamically with or without monitoring by pressure sensors 166, 168 to maintain the susceptor surface substantially planar. An optical emitter 182 and receiver 184 are placed in the deposition chamber 133 at a known distance. Light from the emitter 182 impinges on the substrate surface or on the susceptor surface 22 and is reflected back to the receiver 184 thus measuring the distance between the emitter/receiver and the surface(s). Input to the controller 170 provides real time monitoring of this distance; the controller 170 can vary the throttle valve 162 to maintain the susceptor surface/substrate surface substantially planar (FIG. 2C).

If the real time distance of the monitored surface decreases, this indicates that the susceptor surface is beginning to bow and the controller 170 opens the throttle valve 162 to reduce the shaft pressure to compensate. Likewise, if the distance increases then the shaft pressure is increased to prevent dishing of the susceptor/substrate surfaces. Optionally, the pressure sensor arrangements 166, 168 can be used to monitor the pressure valves in the deposition chamber and the shaft either with or without active input to the controller 170. Thus, they either can be active inputs or can be passive devices to merely monitor and provide readouts of the actual shaft pressure and chamber pressure (FIG. 2C).

A variation of such optical monitoring provides for an emitter 186 on one side of the chamber which emits a light beam across the surface of the susceptor/substrate to a receiver 188 on the opposite side of the chamber. The beam is set at a specific distance, e.g. about 0.2 mm, above the surface of the susceptor/substrate as a barrier. Should the susceptor surface and by extension the substrate surface become bowed or deformed the path of the light beam is interrupted and a signal from the receiver 188 to the controller 170 is interrupted. The controller 170 adjusts the throttle to reduce the shaft pressure until the surface of the susceptor/substrate is planar enough for the receiver 188 to again receive the input signal from the emitter 186. Pressure sensors 166, 168 optionally may be used either actively or passively as described above (FIG. 2C).

It is additionally contemplated that one or more strain gauges 190 may be mounted on the underside of the susceptor plate 20 as a means of monitoring deformation of the susceptor plate 20. The controller 170 monitors the strain gauges 190 to detect bowing or dishing of the susceptor plate. Should deformation occur beyond a tolerable preset limit, the controller 170 adjusts the throttle valve 162 accordingly to either pump down or pump up the pressure in the susceptor shaft 137. Again, pressure sensors 166, 168 optionally may be used either actively or passively as described (FIG. 2C).

EXAMPLE 2

Effect of Vacuum Pumping on Surface Flatness

FIG. 3 compares the change in surface flatness or planarity of a surface of a susceptor support plate for a susceptor shaft at atmospheric pressure (FIG. 3A) with that of a vacuum pumped susceptor shaft. As initially installed, a susceptor is very flat, a zero deviation from planar. As the susceptor is heated and cooled, it starts to lose its planarity. Eventually, as the susceptor is subjected to thermal cycling, it becomes deformed and has the inverted V-shape as shown in the uniformity profile in FIG. 3A and as schematically demonstrated in FIG. 1. This necessitates replacing the susceptor.

If the shaft is pumped, the planarity of the susceptor remains much more constant over time as shown in FIG. 3B; the thermal cycling has a significantly lessened effect on the uniformity of the support plate surface. The functional life of the susceptor is extended requiring fewer replacements. This also provides a more cost effective process and improves throughput as down time is lessened.

EXAMPLE 3

Effect of Vacuum Pumping on Deposition Rate Uniformity

Deposition rate uniformity improves across the susceptor surface when the susceptor shaft is vacuum pumped. FIG. 4 compares the effect of pumping the susceptor shaft on the deposition rate across a substrate, measuring from the top left to the bottom right and from the bottom left to the top right across both substrates. The film of material was deposited on both substrates at a temperature of 450/460° C. and at a pressure of 320 mTorr with a spacing of 920 mil.

Figure 4A:
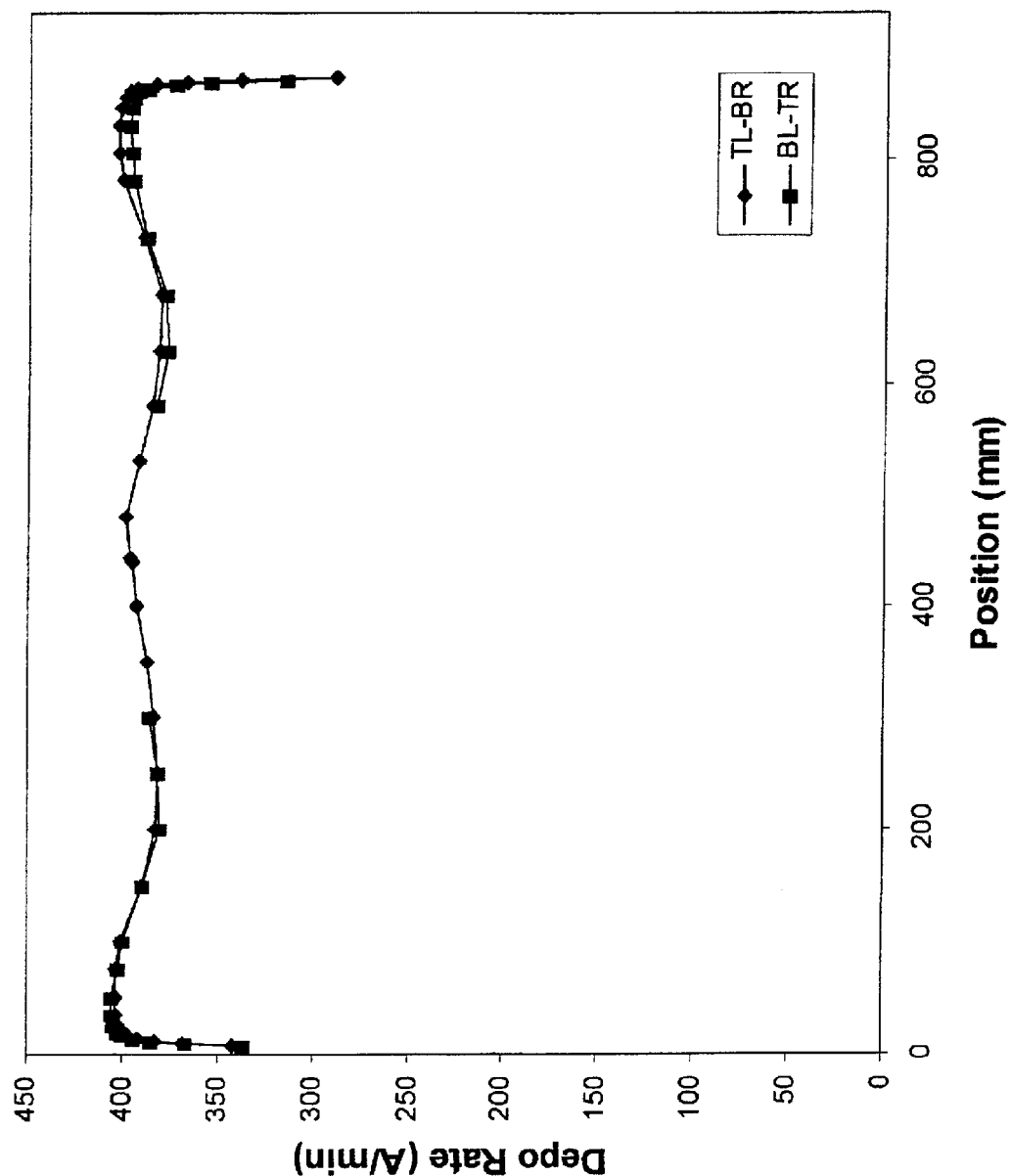
FIG. 4 compares the deposition rate across the surface of the susceptor support plate attached to a shaft without vacuum pumping (FIG. 4A) and with vacuum pumping (FIG. 4B). Temperature: 450/460° C.; pressure: 320 mTorr; spacing: 920 mil.

In FIG. 4A, deformity of the susceptor surface causes the depostion rate to vary significantly across the surface of the substrate. Deposition at the center of the substrate where bowing occurs is higher. Process gases or sputtered material do not have to travel as far across the chamber to deposit on the substrate, thus more of the film is deposited on the substrate at these bowed areas in the same amount of time thereby increasing the deposition rate at these areas and varying the rate across the substrate.

Figure 4B:
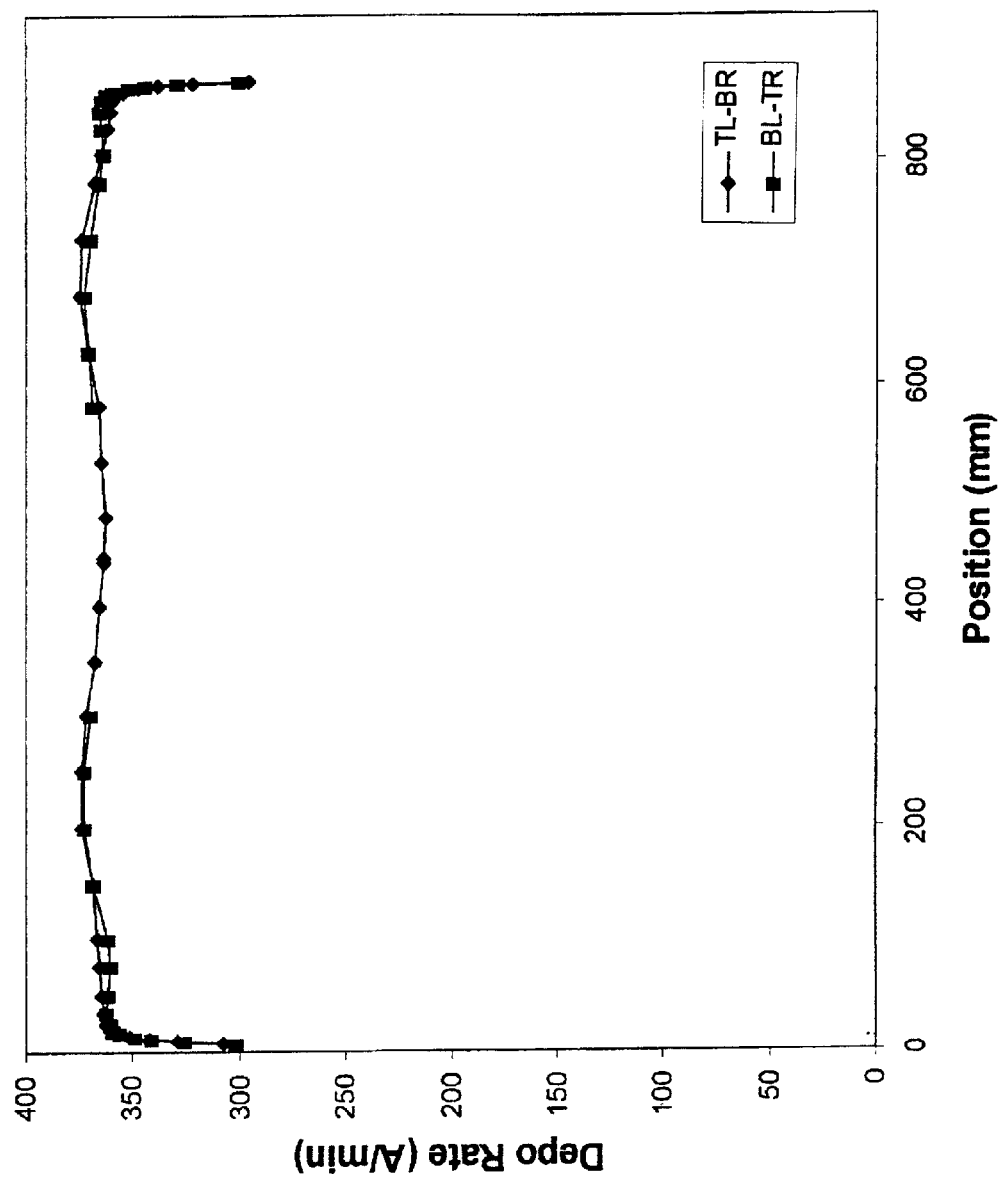

When the susceptor shaft is pumped, the susceptor surface and, by extension, the substrate surface is substantially planar. The distance process gases or sputtered material has to travel across the deposition chamber is relatively equal across the substrate surface, thus insuring that the same amount of material reaches the substrate surface in the same amount of time. The deposition rate across the substrate is therefore more uniform (FIG. 4B).

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of improving the planarity of a support plate of a susceptor for use during deposition of a film of material onto a substrate comprising:
   reducing pressure in a hollow core of a shaft to a first pressure below atmospheric pressure; and
   reducing a pressure in the deposition chamber to a second pressure required for the deposition of the film of material onto the substrate;
   wherein the first pressure in the hollow core of the shaft acts upon a lower surface of the support plate connected to the shaft and interfacing with the hollow core of the shaft and the second pressure in the deposition chamber acts upon an upper surface of the support plate thereby improving planarity.

2. The method of claim 1, wherein reducing the pressure in the hollow core of the shaft comprises:
   sealing the hollow core of the shaft from atmospheric pressure; and
   applying a source of negative pressure to the hollow core of the shaft thereby reducing the second pressure in the hollow core.

3. The method of claim 2, wherein the hollow core is sealed by a shaft vacuum connector housing adapted to connect with the source of the negative pressure.

4. The method of claim 3, wherein the shaft vacuum connector housing comprises a fitting adapted to be connected to the source of negative pressure, the negative pressure being applied to the hollow core through the fitting.

5. The method of claim 1, wherein the upper surface supports the substrate thereon and further comprises a plurality of openings therethrough, the method further comprising:
   applying a vacuum to the substrate through the plurality of openings via a vacuum line passing through the hollow core of the shaft and fluidly connecting with the plurality of openings to affix the substrate to the upper surface.

6. The method of claim 5, wherein a negative pressure generated within the vacuum line is controlled independently from a negative pressure generated within a hollow core of the shaft.

7. The method of claim 1, wherein the second pressure inside the deposition chamber is about 0.5 Torr to about 6 Torr.

8. The method of claim 1, wherein the first pressure inside the hollow core of the shaft is below about 200 Torr.

9. The method of claim 8, wherein the first pressure inside the hollow core of the shaft is about 0.5 Torr to about 200 Torr.

10. The method of claim 9, wherein the first pressure inside the hollow core of the shaft is about equal to the second pressure inside the deposition chamber.

11. A method of improving the planarity of a support plate of a susceptor for use during deposition of a film of material onto a substrate comprising:
   sealing a hollow core of a shaft from atmospheric pressure with a shaft vacuum connector housing, wherein the shaft vacuum connector housing comprises a fitting adapted to connect to a source of negative pressure;
   applying the source of negative pressure to the hollow core of the shaft through the fitting;
   reducing pressure in the hollow core of the shaft through the fitting to a first pressure of about 0.5 to about 200 Torr; and
   reducing pressure in the deposition chamber to a second pressure of about 0.5 Torr to about 200 Torr;
   wherein the first pressure in the hollow core of the shaft acts upon a lower surface of the support plate connected to the shaft and interfacing with the hollow core of the shaft and the second pressure in the deposition chamber acts upon an upper surface of the support plate thereby improving planarity.

12. The method of claim 11, wherein the upper surface supports the substrate thereon and further comprises a plurality of openings therethrough, the method further comprising:
   applying a vacuum to the substrate through the plurality of openings via a vacuum line passing through the hollow core of the shaft and fluidly connecting with the plurality of openings to affix the substrate to the upper surface.

13. The method of claim 12, wherein a negative pressure generated within the vacuum line is controlled independently from a negative pressure generated within the hollow core of the shaft.

14. The method of claim 11, wherein the first pressure inside the hollow core of the shaft is about equal to the second pressure inside the deposition chamber.

15. A method of depositing a film of material onto a substrate, comprising:
   providing a deposition chamber with a susceptor having a support plate with an upper and a lower surface, said upper surface adapted to support the substrate thereon and said lower surface mounted onto a shaft and interfacing with a hollow core sealed from atmospheric pressure;

placing the substrate onto the upper surface of the support plate;

reducing a pressure in the deposition chamber to a deposition pressure;

connecting a source of negative pressure to the hollow core via an input thereto;

reducing a pressure inside the hollow core to a negative pressure below atmospheric pressure via said input;

applying the negative pressure to the lower surface of the support plate;

flowing at least one precursor gas into the deposition chamber; and depositing a film onto the substrate wherein the film is generated at least in part from the at least one precursor gas.

16. The method of claim 15, further comprising the step of:

bringing the temperature inside the deposition chamber to at least 300° C.

17. The method of claim 16, wherein the temperature is brought to about 400° C. to about 450° C.

18. The method of claim 15, wherein the deposition pressure in the deposition chamber is about 0.5 Torr to about 6 Torr.

19. The method of claim 18, wherein the pressure in the hollow core of the shaft is below about 200 Torr.

20. The method of claim 19, wherein the pressure in the hollow core of the shaft is about equal to the deposition pressure in the deposition chamber.

21. The method of claim 15, further comprising the steps of:

monitoring the deposition pressure and the pressure inside the hollow core of the shaft; and adjusting the pressure inside the hollow core of the shaft when it exceeds a value outside a predetermined value range relative to the pressure in the deposition chamber.

22. The method of claim 15, further comprising the steps of:

monitoring the planarity of a surface of the substrate onto which the film is to be deposited; and adjusting the pressure inside the hollow core of the shaft when the surface of the substrate deforms by more than a predetermined acceptable amount from perfectly planar thereby bringing the susceptor and the substrate back within acceptable planarity limits.

23. The method of claim 15, wherein the upper surface supports the substrate thereon and further comprises a plurality of openings therethrough, the method further comprising:

applying a vacuum to the substrate through the plurality of openings via a vacuum line passing through the hollow core of the shaft and fluidly connecting with the plurality of openings to affix the substrate to the upper surface.

24. The method of claim 23, wherein a negative pressure generated within the vacuum line is controlled independently from a negative pressure generated within the hollow core of the shaft.

25. The method of claim 23, wherein the negative pressure in the vacuum line is generated from a source independent of a source of a negative pressure generated within the hollow core of the shaft.

26. The method of claim 15, wherein the hollow core is sealed from atmospheric pressure by a shaft vacuum connector housing.

27. The method of claim 26, wherein the shaft vacuum connector housing comprises an input to a source of negative pressure.

28. A method of depositing a film on a substrate comprising:

providing a deposition chamber with a susceptor having a support plate with an upper and a lower surface, said upper surface adapted to support the substrate thereon and said lower surface mounted onto a shaft and interfacing with a hollow core sealed from atmospheric pressure;

placing the substrate onto the upper surface of the support plate;

bringing the temperature inside the deposition chamber to at least 300° C.;

reducing a pressure in the deposition chamber to a deposition pressure of about 0.5 Torr to about 6 Torr;

connecting a source of negative pressure to the hollow core via an input thereto;

reducing a pressure inside the hollow core to a negative pressure of about 0.5 Torr to about 200 Torr via said input;

applying the negative pressure in the hollow core to the lower surface of the support plate;

flowing at least one precursor gas into the deposition chamber;

depositing a film onto the substrate wherein the film is generated at least in part from the at least one precursor gas;

monitoring the deposition pressure and the pressure inside the hollow core of the shaft; and adjusting the pressure inside the hollow core of the shaft when it exceeds a value outside a predetermined value range relative to the pressure in the deposition chamber during deposition of the film of material onto the substrate.

29. The method of claim 28, wherein the temperature is brought to about 400° C. to about 450° C.

30. The method of claim 28, wherein the negative pressure in the hollow core of the shaft is equal to the deposition pressure in the deposition chamber.

31. The method of claim 28, wherein the negative pressure in the hollow core of the shaft is equal to the deposition pressure in the deposition chamber.

32. The method of claim 28, wherein the upper surface supports the substrate thereon and further comprises a plurality of openings therethrough, the method further comprising:

applying a vacuum to the substrate through the plurality of openings via a vacuum line passing through the hollow core of the shaft and fluidly connecting with the plurality of openings to affix the substrate to the upper surface.

33. The method of claim 32, wherein a negative pressure generated within the vacuum line is controlled independently from a negative pressure generated within the hollow core of the shaft.

34. The method of claim 32, wherein the negative pressure in the vacuum line is generated from a source independent of a source of a negative pressure generated within the hollow core of the shaft.

35. The method of claim 28, wherein the hollow core is sealed from atmospheric pressure by a shaft vacuum connector housing.

36. The method of claim 35, wherein the shaft vacuum connector housing comprises an input to a source of negative pressure.

37. A method of depositing a film on a substrate comprising:
- providing a deposition chamber with a susceptor having a support plate with an upper and a lower surface, said upper surface adapted to support the substrate thereon and said lower surface mounted onto a shaft and interfacing with a hollow core sealed from atmospheric pressure;
- placing the substrate onto the upper surface of the support plate;
- bringing the temperature inside the deposition chamber to at least 300° C.;
- reducing a pressure in the deposition chamber to a deposition pressure of about 0.5 Torr to about 6 Torr;
- connecting a source of negative pressure to the hollow core via an input thereto;
- reducing a pressure inside the hollow core to a negative pressure of about 0.5 Torr to about 200 Torr via said input;
- applying the pressure in the hollow core to the lower surface of the support plate;
- flowing at least one precursor gas into the deposition chamber;
- depositing a film onto the substrate wherein the film is generated at least in part from the at least one precursor gas;
- monitoring the planarity of a surface of the substrate onto which the film is to be deposited; and
- adjusting the pressure inside the hollow core of the shaft when the surface of the substrate deforms by more than a predetermined acceptable amount from perfectly planar thereby bringing the susceptor and the substrate back within acceptable planarity limits during deposition of the film of material onto the substrate.

38. The method of claim 37, wherein the temperature is brought to about 400° C. to about 450° C.

39. The method of claim 37, wherein the upper surface supports the substrate thereon and further comprises a plurality of openings therethrough, the method further comprising:
- applying a vacuum to the substrate through the plurality of openings via a vacuum line passing through the hollow core of the shaft and fluidly connecting with the plurality of openings to affix the substrate to the upper surface.

40. The method of claim 39, wherein a negative pressure generated within the vacuum line is controlled independently from a negative pressure generated within the hollow core of the shaft.

41. The method of claim 39, wherein the negative pressure in the vacuum line is generated from a source independent of a source of a negative pressure generated within the hollow core of the shaft.

42. The method of claim 37, wherein the hollow core is sealed from atmospheric pressure by a shaft vacuum connector housing.

43. The method of claim 42, wherein the shaft vacuum connector housing comprises an input to a source of negative pressure.

* * * * *